(12) United States Patent
Kuo et al.

(10) Patent No.: US 11,404,308 B2
(45) Date of Patent: *Aug. 2, 2022

(54) SEMICONDUCTOR PACKAGE AND METHOD

(71) Applicant: Taiwan Semiconductor Manufacturing Co., Ltd., Hsinchu (TW)

(72) Inventors: Hung-Jui Kuo, Hsinchu (TW); Yun Chen Hsieh, Baoshan Township (TW); Hui-Jung Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/098,729

(22) Filed: Nov. 16, 2020

(65) Prior Publication Data

US 2021/0082745 A1  Mar. 18, 2021

Related U.S. Application Data

(63) Continuation of application No. 16/717,881, filed on Dec. 17, 2019, now Pat. No. 10,840,129, which is a
(Continued)

(51) Int. Cl.
*H01L 21/768* (2006.01)
*H01L 21/56* (2006.01)

(52) U.S. Cl.
CPC ........ *H01L 21/76805* (2013.01); *H01L 21/56* (2013.01); *H01L 21/76879* (2013.01)

(58) Field of Classification Search
CPC ......... H01L 21/76805; H01L 21/76879; H01L 21/56
(Continued)

(56) References Cited

U.S. PATENT DOCUMENTS 5,817,579 A  10/1998  Ko et al.
8,361,842 B2  1/2013  Yu et al.
(Continued)

FOREIGN PATENT DOCUMENTS

CN  102754196 A  10/2012
DE  102016115788 A1  4/2017
KR  20160010357 A  1/2016

OTHER PUBLICATIONS

Dow Chemical Company, "Processing Procedures for CYCLOTENE 4000 Series Photo BCB Resins—DS2100 Puddle Develop Process," CYCLOTENE Advanced Electronic Resins, Mar. 2009, 10 pages.

*Primary Examiner* — Vu A Vu
(74) *Attorney, Agent, or Firm* — Slater Matsil, LLP

(57) ABSTRACT

In an embodiment, a method includes: forming a first dielectric layer over a die, the first dielectric layer including a photo-sensitive material; curing the first dielectric layer to reduce photo-sensitivity of the first dielectric layer; patterning the first dielectric layer by etching to form a first opening; forming a first metallization pattern in the first opening of the first dielectric layer; forming a second dielectric layer over the first metallization pattern and the first dielectric layer, the second dielectric layer including the photo-sensitive material; patterning the second dielectric layer by exposure and development to form a second opening; and forming a second metallization pattern in the second opening of the second dielectric layer, the second metallization pattern electrically connected to the first metallization pattern.

20 Claims, 24 Drawing Sheets

Related U.S. Application Data continuation of application No. 16/052,334, filed on Aug. 1, 2018, now Pat. No. 10,515,848.

(58) Field of Classification Search
USPC .......................................................... 438/127
See application file for complete search history.

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 10,515,848 B1* | 12/2019 | Kuo .................... H01L 25/105 |
| 2003/0211727 A1 | 11/2003 | Chen et al. |
| 2005/0133920 A1 | 6/2005 | Liou et al. |
| 2006/0091476 A1 | 5/2006 | Pinnow et al. |
| 2007/0125750 A1 | 6/2007 | Weng et al. |
| 2009/0236686 A1 | 9/2009 | Shim et al. |
| 2010/0203732 A1 | 8/2010 | Doris et al. |
| 2011/0089531 A1 | 4/2011 | Hillman et al. |
| 2011/0115094 A1 | 5/2011 | Darnon et al. |
| 2011/0198762 A1 | 8/2011 | Scanlan |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0259194 A1 | 9/2015 | Lin et al. |
| 2016/0021754 A1 | 1/2016 | Chen et al. |
| 2016/0071820 A1* | 3/2016 | Yu .................... H01L 21/6836 257/737 |
| 2017/0032977 A1 | 2/2017 | Chen et al. |
| 2017/0338204 A1 | 11/2017 | Lee et al. |
| 2018/0026023 A1 | 1/2018 | Lin et al. |

* cited by examiner

SEMICONDUCTOR PACKAGE AND METHOD

PRIORITY CLAIM AND CROSS-REFERENCE

This application is a continuation of U.S. patent application Ser. No. 16/717,881, filed on Dec. 17, 2019, entitled "Semiconductor Package and Method," which is a continuation of U.S. patent application Ser. No. 16/052,334, filed on Aug. 1, 2018, entitled "Semiconductor Package and Method," now U.S. Pat. No. 10,515,848, issued on Dec. 24, 2019, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
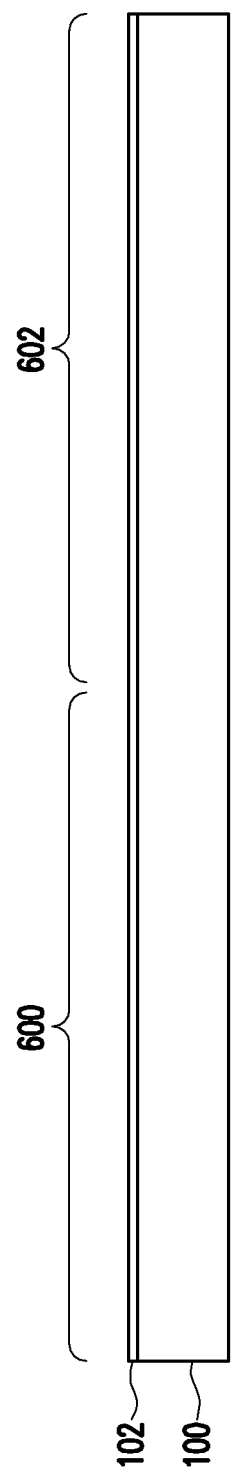
FIGS. 1 through 16 illustrate cross-sectional views of intermediate steps during a process for forming device packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a photo-sensitive dielectric layer is formed on a die. The photo-sensitive dielectric layer may be a bottom layer of a redistribution structure. The photo-sensitive dielectric layer is patterned by forming a photoresist over the photo-sensitive dielectric layer, patterning the photoresist, and transferring the pattern to the photo-sensitive dielectric layer with a plasma etching process. The photo-sensitive dielectric layers of subsequently-formed redistribution structure layers are patterned by exposing the photo-sensitive materials to light and exposing them. A higher via aspect ratio of may be achieved by patterning the bottom layer with a lithography and plasma etching process, notwithstanding that the bottom layer could be patterned by exposure to light and development.

FIGS. 1 through 16 illustrate cross-sectional views of intermediate steps during a process for forming first packages 200, in accordance with some embodiments. A first package region 600 and a second package region 602 are illustrated, and a first package 200 is formed in each package region. The first packages 200 may also be referred to as integrated fan-out (InFO) packages.

In FIG. 1, a carrier substrate 100 is provided, and a release layer 102 is formed on the carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of planarity.

Figure 2:
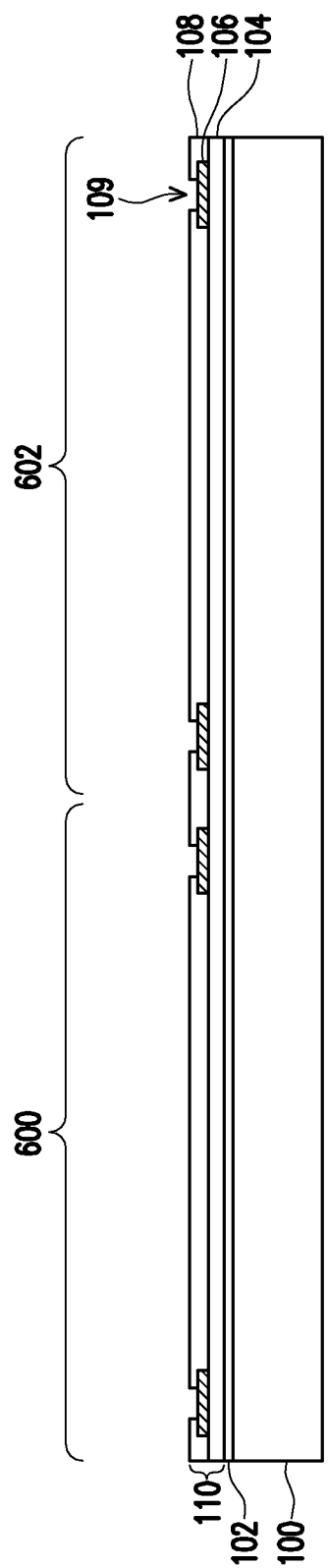

In FIG. 2, a dielectric layer 104, a metallization pattern 106 (sometimes referred to as redistribution layers or redistribution lines), and a dielectric layer 108 are formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 106. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 106.

The dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings 109 to expose portions of the metallization pattern 106. The patterning may be by an acceptable process, such as by exposing the dielectric layer 108 to light when the dielectric layer 108 is a photo-sensitive material or by etching using, for example, an anisotropic etch.

The dielectric layers 104 and 108 and the metallization pattern 106 may be referred to as a back-side redistribution structure 110. In the embodiment shown, the back-side redistribution structure 110 includes the two dielectric layers 104 and 108 and one metallization pattern 106. In other embodiments, the back-side redistribution structure 110 can include any number of dielectric layers, metallization patterns, and conductive vias. One or more additional metallization pattern and dielectric layer may be formed in the back-side redistribution structure 110 by repeating the processes for forming the metallization pattern 106 and dielectric layer 108. Conductive vias (not shown) may be formed during the formation of a metallization pattern by forming the seed layer and conductive material of the metallization pattern in the opening of the underlying dielectric layer. The conductive vias may therefore interconnect and electrically couple the various metallization patterns.

Figure 3:
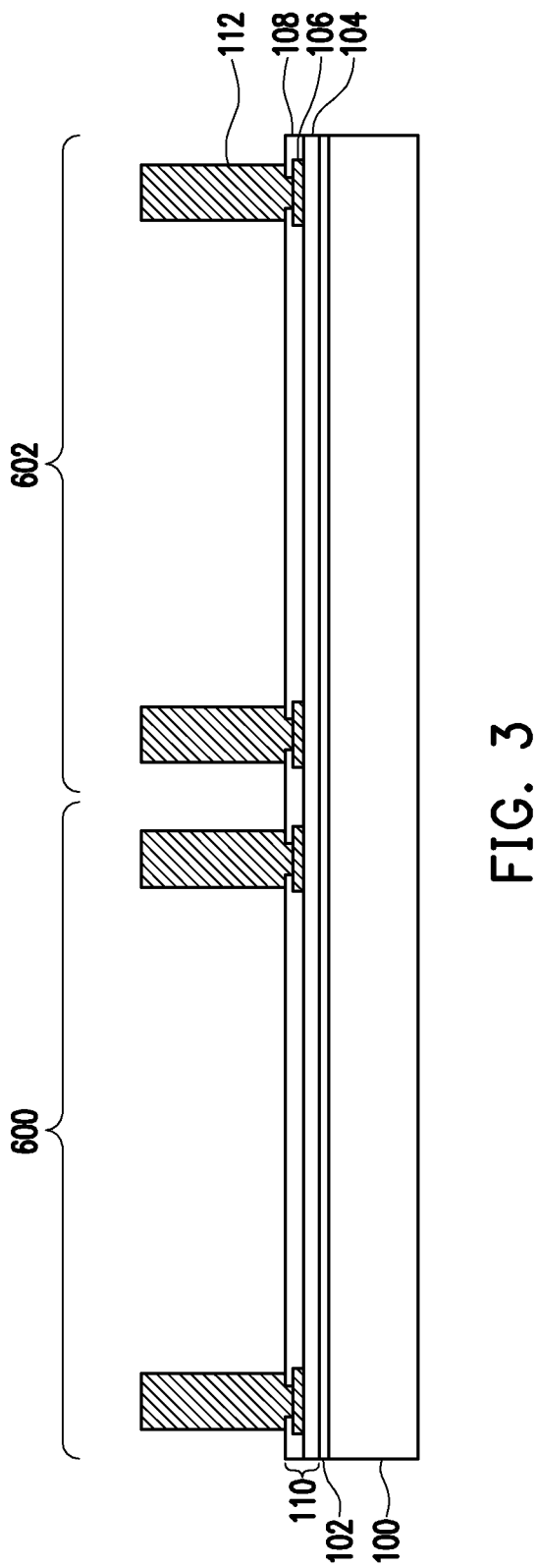

In FIG. 3, through vias 112 are formed. As an example to form the through vias 112, a seed layer is formed over the back-side redistribution structure 110, e.g., on the dielectric layer 108 and portions of the metallization pattern 106 exposed by the openings 109. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to through vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 112.

Figure 4:
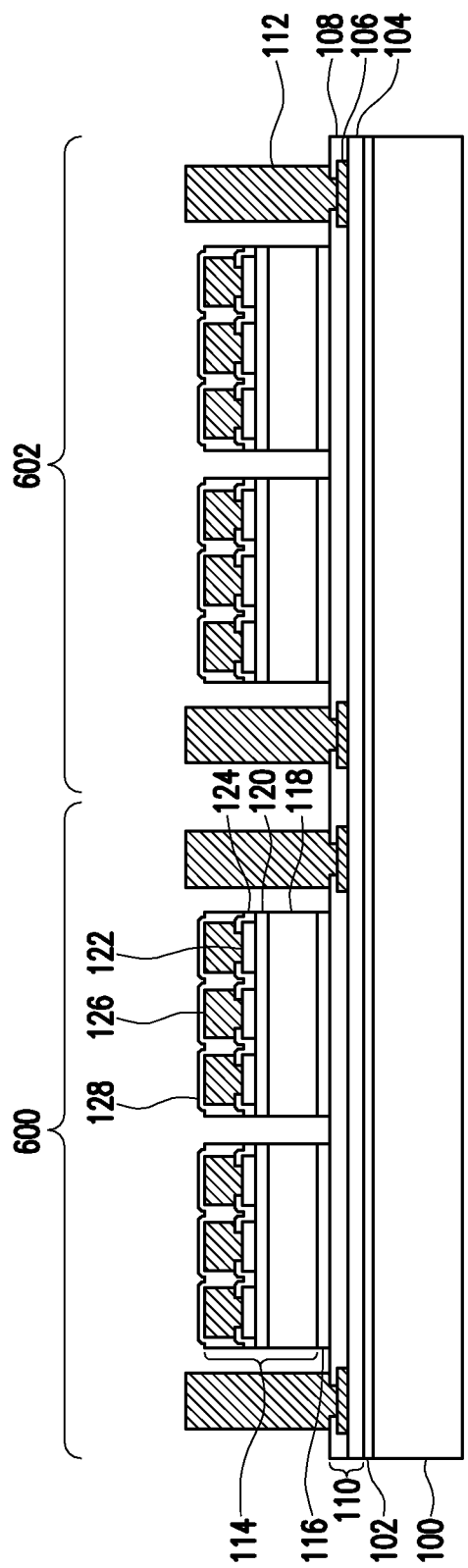

In FIG. 4, integrated circuit dies 114 are adhered to the dielectric layer 108 by an adhesive 116. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on back-sides of the integrated circuit dies 114 and adheres the integrated circuit dies 114 to the back-side redistribution structure 110, such as the dielectric layer 108. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Although two integrated circuit dies 114 are illustrated as being adhered in each of the first package region 600 and the second package region 602, it should be appreciated that more or less integrated circuit dies 114 may be adhered in each package region. For example, only one integrated circuit die 114 may be adhered in each region. Further, the integrated circuit dies 114 may vary in size. In some embodiments, the integrated circuit die 114 may be dies with a large footprint, such as system-on-chip (SoC) devices. In embodiments where the integrated circuit die 114 have a large footprint, the space available for the through vias 112 in the package regions may be limited. Use of the back-side redistribution structure 110 allows for an improved interconnect arrangement when the package regions have limited space available for the through vias 112.

Figure 5:
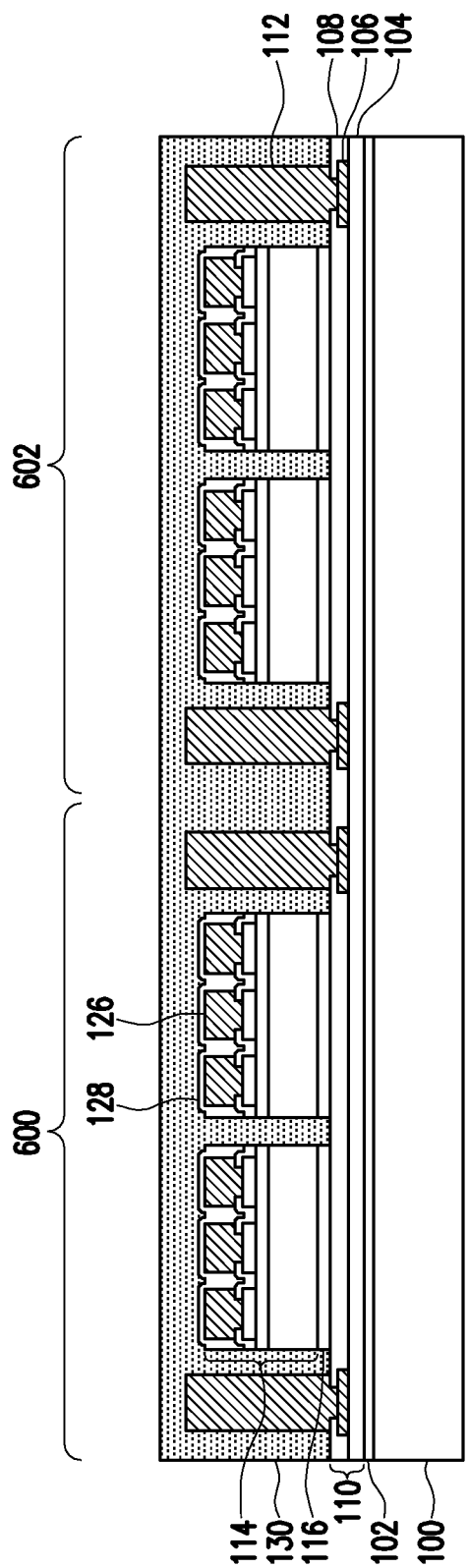

In FIG. 5, an encapsulant 130 is formed on the various components. The encapsulant 130 may be a molding compound, epoxy, or the like, and may be applied by compression molding, transfer molding, or the like. The encapsulant 130 may be formed over the carrier substrate 100 such that the through vias 112 and/or the die connectors 126 of the integrated circuit dies 114 are buried or covered. The encapsulant 130 is then cured.

Figure 6:
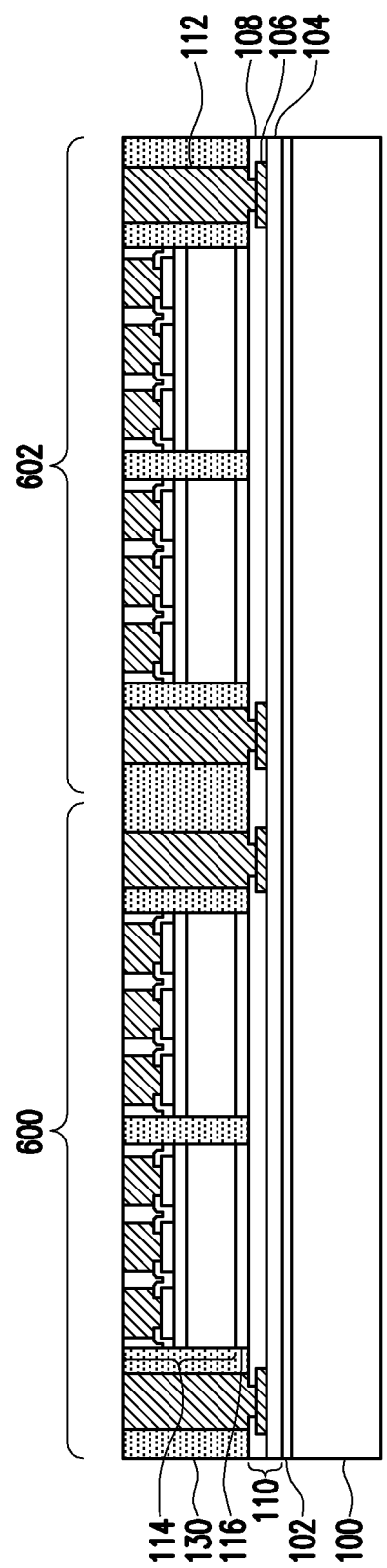

In FIG. 6, a planarization process is performed on the encapsulant 130 to expose the through vias 112 and the die connectors 126. The planarization process may also grind the dielectric material 128. Top surfaces of the through vias 112, die connectors 126, dielectric material 128, and encapsulant 130 are coplanar after the planarization process. The planarization process may be, for example, a chemical-mechanical polish (CMP), a grinding process, or the like. In some embodiments, the planarization may be omitted, for example, if the through vias 112 and die connectors 126 are already exposed.

In FIGS. 7 through 14, a front-side redistribution structure 140 is formed. As will be illustrated, the front-side redistribution structure 140 includes dielectric layers 142, 160, 174, and 178; metallization patterns 144, 162, and 176; and under bump metallurgies (UBMs) 182. The metallization patterns may also be referred to as redistribution layers or redistribution lines, and include conductive vias and conductive lines.

Figure 7:
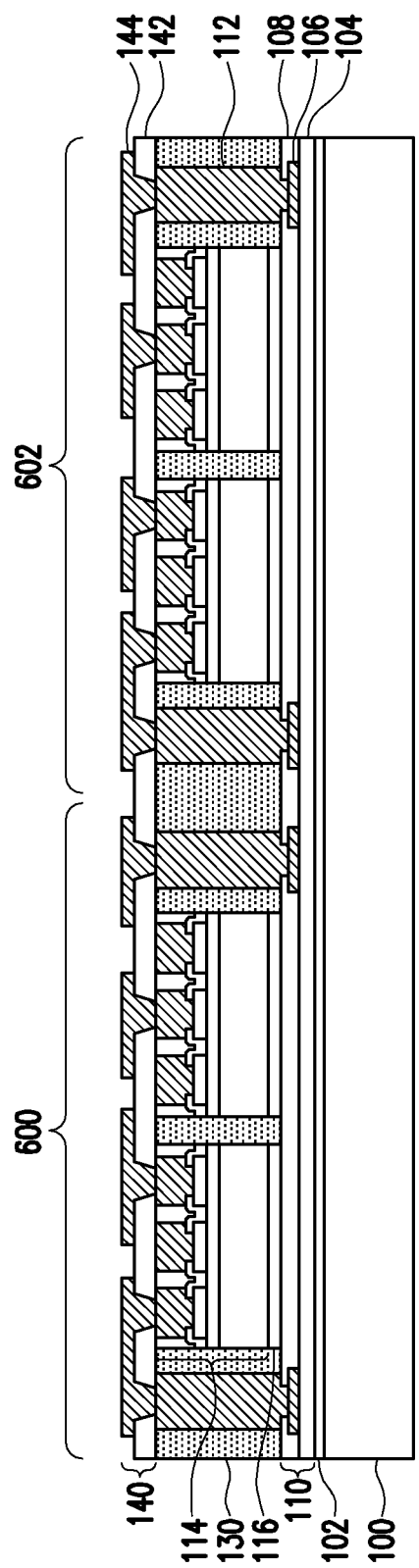

In FIG. 7, the dielectric layer 142 is deposited on the encapsulant 130, through vias 112, and die connectors 126. The dielectric layer 142 is formed of a photo-sensitive material such as PBO, polyimide, BCB, or the like, which may be patterned using a lithography mask. In an embodiment, the dielectric layer 142 is a photo-sensitive polyimide. The dielectric layer 142 may be formed by spin coating, lamination, CVD, the like, or a combination thereof. The dielectric layer 142 is then cured. The curing may be by, e.g., a thermal curing or the like. The dielectric layer 142 loses its photo-sensitivity (or at least has reduced photo-sensitivity) when cured. The cured, non-photo-sensitive dielectric layer 142 may be referred to as a passivation layer. The metallization pattern 144 is then formed on and extending through the dielectric layer 142. Several methods may be used to form the metallization pattern 144.

FIGS. 8A through 8F illustrate a process for forming the metallization pattern 144, in accordance with an embodiment. In this embodiment, a plasma etching process is used for patterning the dielectric layer 142.

Figure 8A:
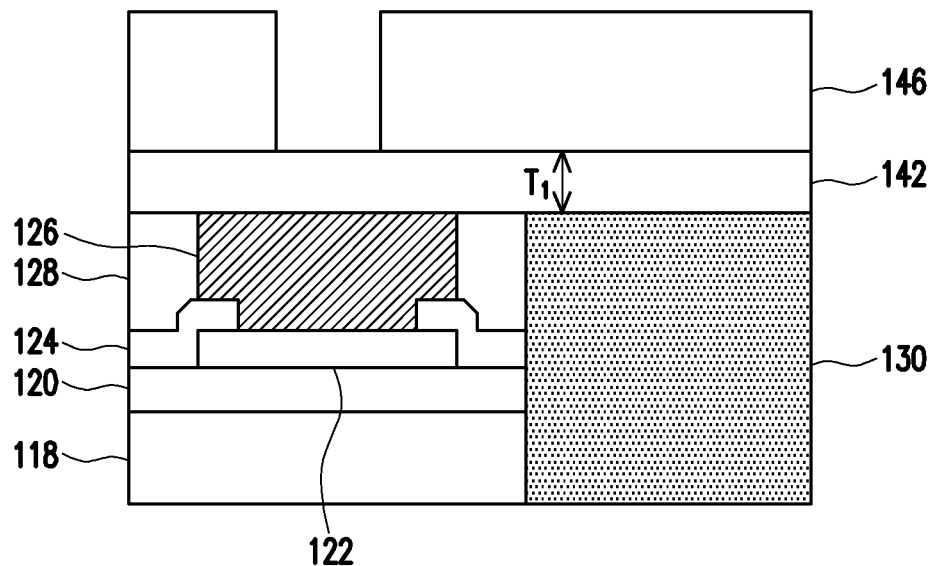

In FIG. 8A, a photoresist 146 is formed on the dielectric layer 142. The photoresist 146 may be a single-layer photoresist, a tri-layer photoresist, or the like, and is formed directly on (e.g., contacting) the dielectric layer 142 in the embodiment shown. The photoresist 146 may be formed by spin coating or the like and may be exposed to light for patterning. In some embodiments, the photoresist 146 includes a bottom anti-reflective coating (BARC) or an absorptive layer, such that only the photoresist 146 is exposed to light, and the dielectric layer 142 is not exposed to light or developed. The patterning forms openings through the photoresist 146 to expose the dielectric layer 142.

Figure 8B:
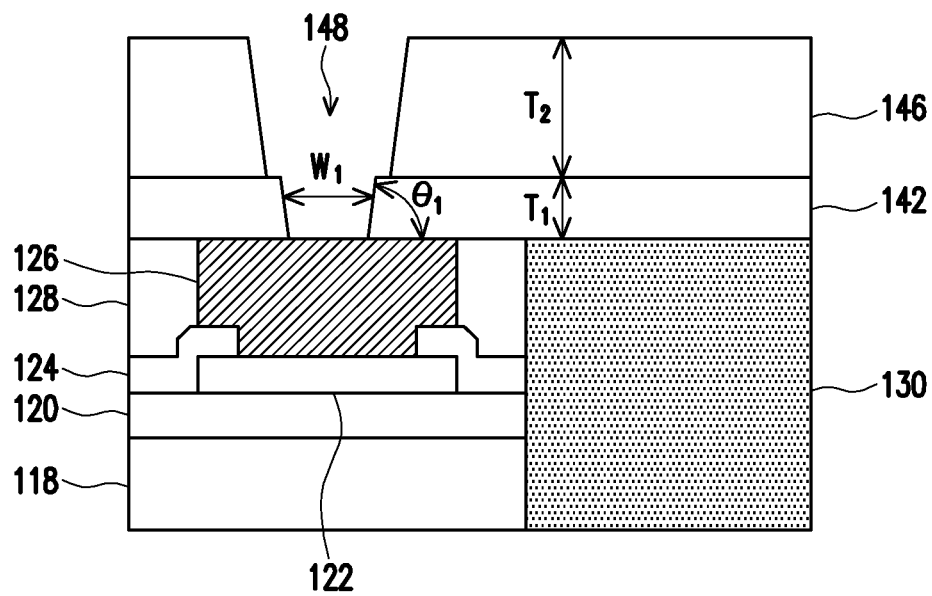

In FIG. 8B, the dielectric layer 142 is patterned by transferring the pattern of the photoresist 146 to the dielectric layer 142. The patterning forms openings 148 through the dielectric layer 142 to expose portions of the die connectors 126 and/or the through vias 112 (not shown). The dielectric layer 142 is formed to a thickness $T_1$ of from about 1 μm to about 30 μm, such as about 20 μm. As will be discussed further below, the openings 148 have widths $W_1$, which depends on the thickness $T_1$ of the dielectric layer 142 and the process used for forming the openings 148. The widths $W_1$ may be from about 1 μm to about 10 μm, such as about 3 μm.

The patterning may be by an etching process, such as a plasma etching process. The plasma etching process uses one or more precursors (sometimes referred to as etch gases) at ratios that achieve a particular etch selectivity between the photoresist 146 and the dielectric layer 142. The precursors used may include $O_2$, $CF_4$, $N_2$, Ar, and combinations thereof. In some embodiments, the precursors include $O_2$ (e.g., oxygen) and $CF_4$ (e.g., tetrafluoromethane) at a ratio of from about 6:1 to about 8:1. During the plasma etching process, some of the photoresist 146 is consumed, reducing the thickness $T_2$ of the photoresist 146. The amount of photoresist 146 consumed by the plasma etching process depends on the etch selectivity between the photoresist 146 and the dielectric layer 142 relative the plasma etching process.

After the patterning, sidewalls of the openings 148 form angles $\theta_1$ with a plane parallel to a major surface of the dielectric layer 142. The steepness of the angles $\theta_1$ depends on the initial thickness $T_2$ of the photoresist 146; forming the photoresist 146 of a larger thickness $T_2$ allows the angles $\theta_1$ to be greater. In the embodiment shown, the angles $\theta_1$ may be from about 75 degrees to about 85 degrees. Notably, although the dielectric layer 142 is itself photo-sensitive when formed, it is nonetheless patterned with a photolithography and etching process using the photoresist 146. Forming the openings 148 with the photolithography and etching process may allow the sidewall angles $\theta_1$ to be greater than sidewall angles formed when the openings 148 are formed by patterning the dielectric layer 142 through light exposure and development. Because the openings 148 are formed with steeper sidewall angles $\theta_1$, the openings 148 may also be formed with smaller widths $W_1$, increasing the aspect ratio of the openings 148. Further, forming the openings 148 by a photolithography and etching process may avoid problems (e.g., contacts remaining covered or partially covered) that arise when the dielectric layer 142 is underdeveloped.

Figure 8C:
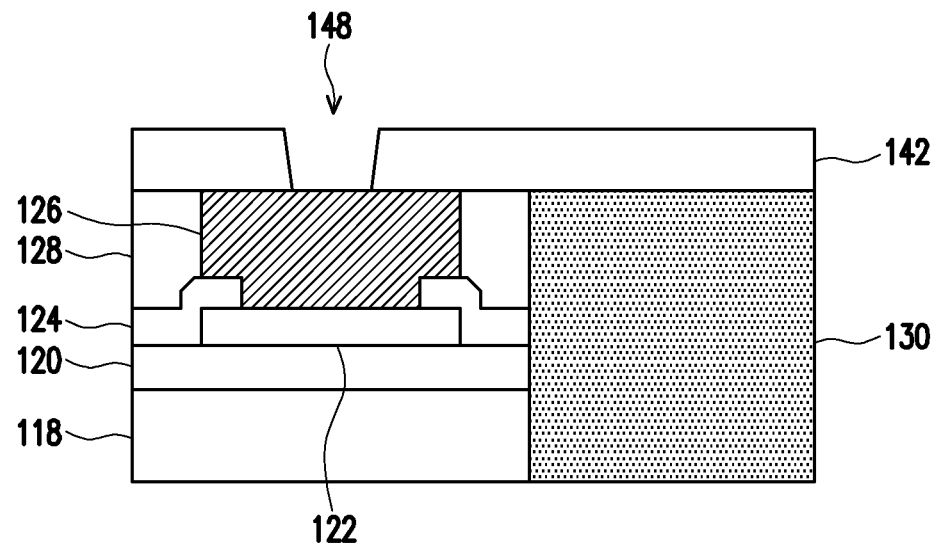

In FIG. 8C, the photoresist 146 is removed. The photoresist 146 may be removed by an acceptable ashing or stripping process, such as using an oxygen plasma or the like.

Figure 8D:
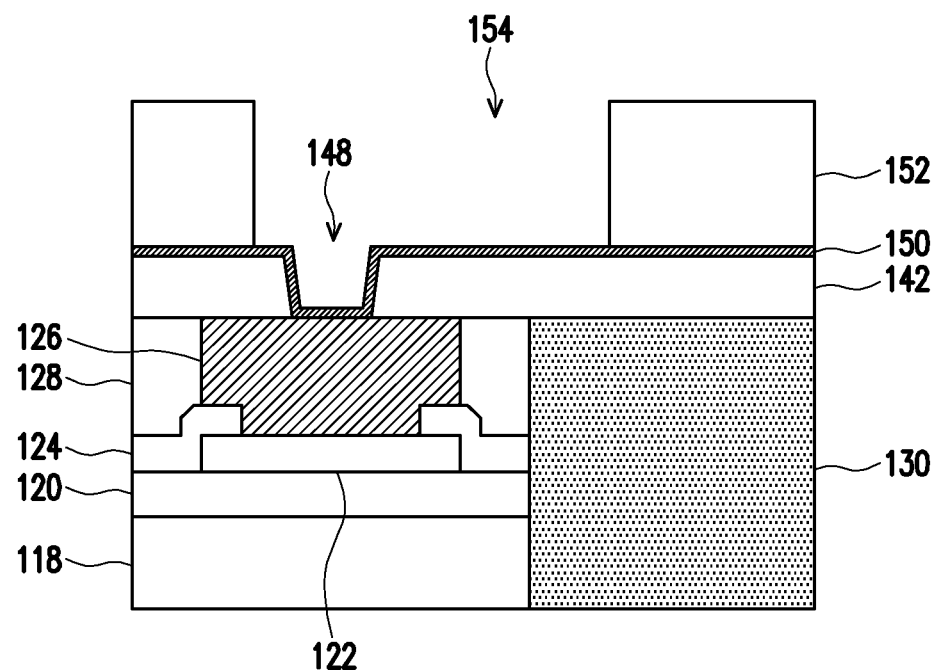

In FIG. 8D, a seed layer 150 is formed over the dielectric layer 142 and in the openings 148 through the dielectric layer 142. In some embodiments, the seed layer 150 is a metal layer, which may be a single layer or a composite layer including a plurality of sub-layers formed of different materials. In some embodiments, the seed layer 150 includes a titanium layer and a copper layer over the titanium layer. The seed layer 150 may be formed using, for example, PVD or the like. A photoresist 152 is then formed and patterned on the seed layer 150. The photoresist 152 may be formed by spin coating or the like and may be exposed to light for patterning. The pattern of the photoresist 152 corresponds to the metallization pattern 144. The patterning forms openings 154 through the photoresist 152 to expose the seed layer 150.

Figure 8E:
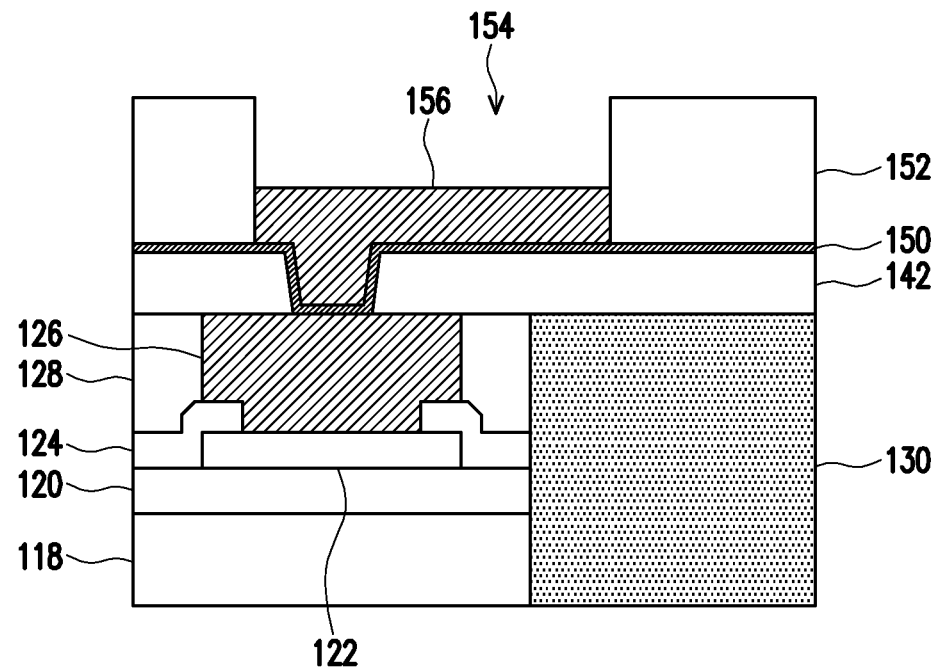

In FIG. 8E, a conductive material 156 is formed in the openings 154 of the photoresist 152 and on the exposed portions of the seed layer 150. The conductive material 156 may be formed by plating, such as electroplating or electroless plating, or the like. The conductive material 156 may comprise a metal such as copper, titanium, tungsten, aluminum, or the like.

Figure 8F:
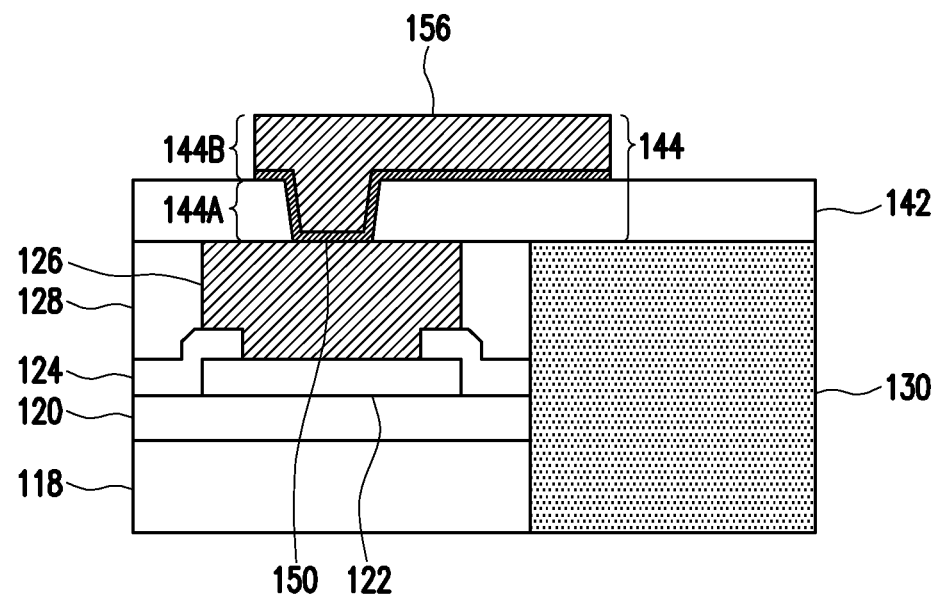

In FIG. 8F, the photoresist 152 and portions of the seed layer 150 on which the conductive material 156 is not formed are removed. The photoresist 152 may be removed by an acceptable ashing or stripping process, such as using an oxygen plasma or the like. Once the photoresist 152 is removed, exposed portions of the seed layer 150 are removed, such as by using an acceptable etching process, such as by wet or dry etching. The remaining portions of the seed layer 150 and conductive material 156 form the metallization pattern 144, which has conductive vias 144A and conductive lines 144B. The conductive vias 144A are formed in the openings 148 through the dielectric layer 142 to, e.g., the die connectors 126 and/or the through vias 112 (not shown). The conductive lines 144B are formed along the top surface of the dielectric layer 142.

FIGS. 9A through 9G illustrate a process for forming the metallization pattern 144, in accordance with another embodiment. In this embodiment, a plasma etching process is used for patterning the dielectric layer 142, and an additional masking layer is used in the plasma etching process. Descriptions of similar features from the previous embodiment are not repeated herein.

Figure 9A:
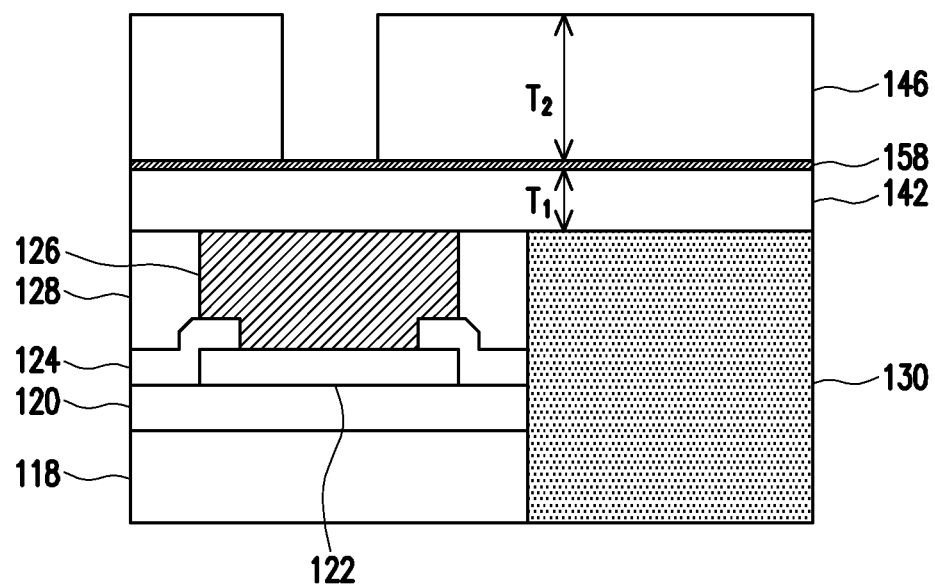

In FIG. 9A, a mask layer 158 is formed on the dielectric layer 142. The mask layer 158 may be formed from a metal or a metal-containing material such as Ti, Cu, TiW, TaN, TiN, combinations thereof, or multilayers thereof, and may be referred to as a hardmask layer. The mask layer 158 is formed from a material that has a high etch selectivity with both the photoresist 146 and the dielectric layer 142 relative the etching process used for patterning the dielectric layer 142. The mask layer 158 is thin as compared to the dielectric layer 142, and may be formed by a deposition process such as PVD, CVD, or the like. In some embodiments, the mask layer 158 is formed using the same process and material(s) used for forming the seed layer 150. The photoresist 146 is then formed on the mask layer 158, and is patterned.

Figure 9B:
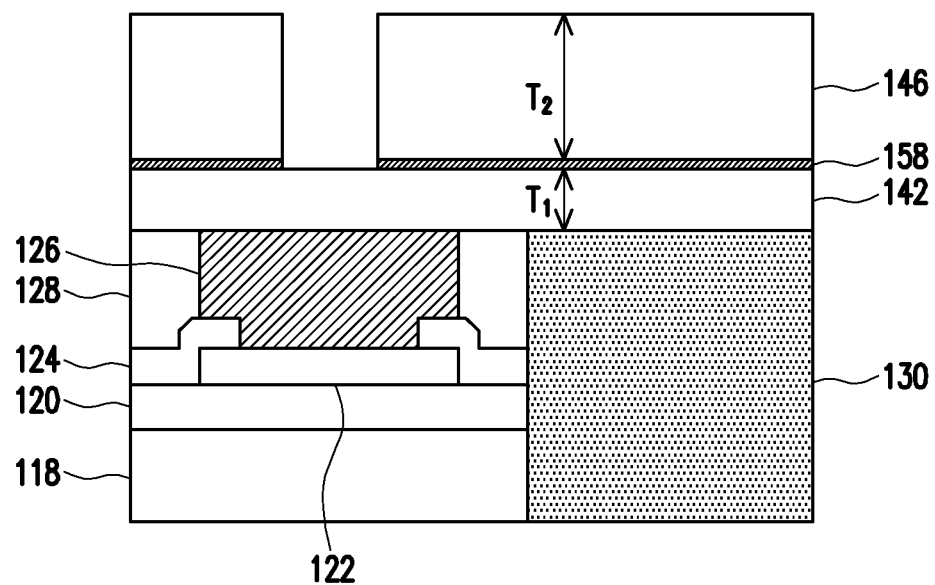

In FIG. 9B, the mask layer 158 is patterned by transferring the pattern of the photoresist 146 to the mask layer 158. The mask layer 158 may be patterned by an acceptable etching process, such as by wet etching, dry etching, or a combination thereof, using the patterned photoresist 146 as an etching mask. In embodiments where the mask layer 158 includes a titanium layer and a copper layer over the titanium layer, the copper layer may be removed with a wet etch, and the titanium layer may be removed with a dry etch. The wet etch may be performed with etchants that are selective to the copper portion of the mask layer 158 and have good wettability with photoresist materials. For example, the etchants may include an aqueous of hydrogen peroxide, phosphoric acid, sulfuric acid, combinations thereof, or the like. The dry etch may be a plasma etch that is selective to the titanium portion of the mask layer 158, and may be performed with precursors such as fluoride, oxygen, and nitrogen.

Figure 9C:
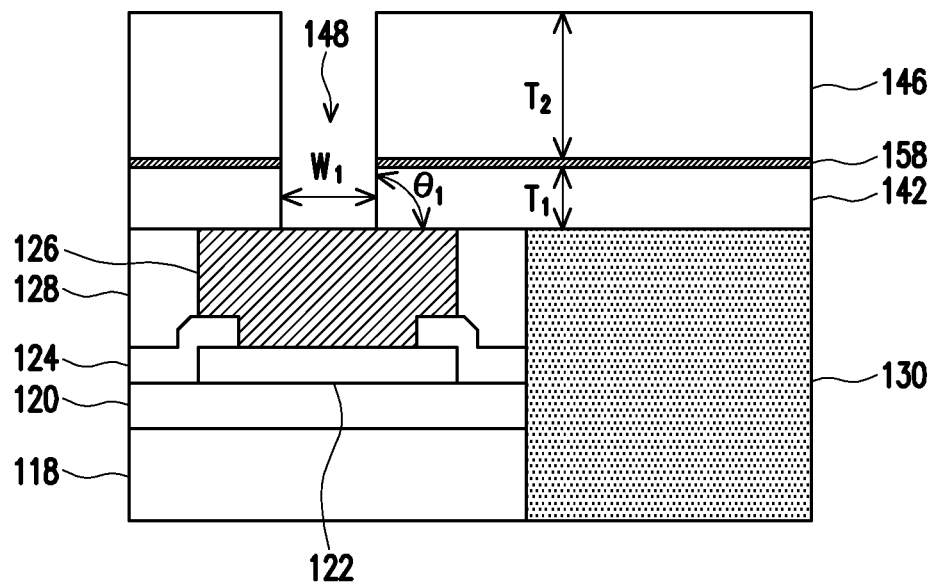

In FIG. 9C, the dielectric layer 142 is patterned by transferring the pattern of the mask layer 158 to the dielectric layer 142. The dielectric layer 142 is formed to a thickness $T_1$ of from about 1 μm to about 30 μm. The dielectric layer 142 may be patterned using a plasma etching process, similar to the one described above, however, the plasma etching process may be varied to account for the material of the mask layer 158. For example, when the mask layer 158 is formed from titanium and copper, the precursors used may include fluoride and oxygen at a ratio of from about 20:1 to about 1:20. By using the mask layer 158 as an additional mask for the etching processes, the widths $W_1$ of the openings 148 may be further reduced and the sidewall angles $\theta_1$ of the openings 148 may be further increased. For example, in the embodiment shown, the widths $W_1$ may be from about 1 μm to about 10 μm, and the sidewall angles $\theta_1$ may be from about 85 degrees to about 90 degrees.

Figure 9D:
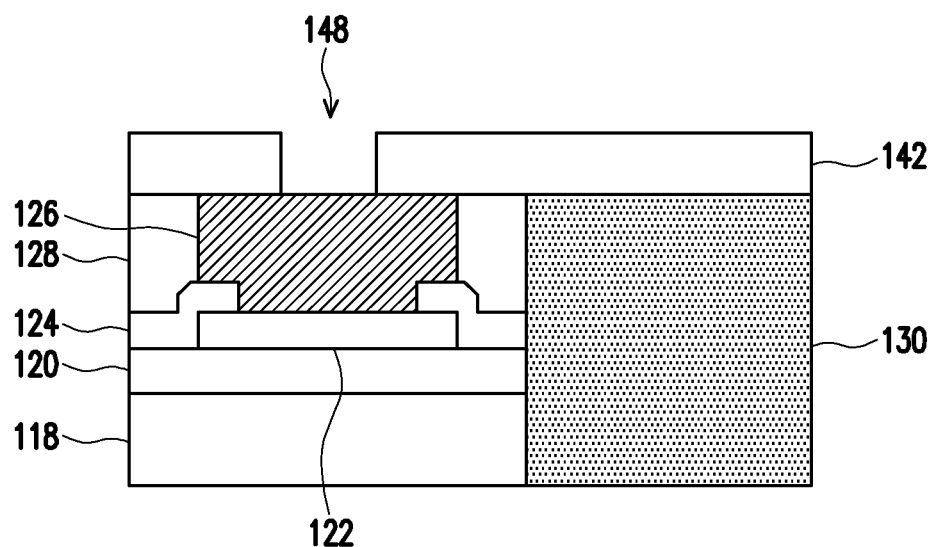

In FIG. 9D, the photoresist 146 and mask layer 158 are removed. The photoresist 146 may be removed by an acceptable ashing or stripping process. The mask layer 158 may be removed by an acceptable etching process, such as by wet or dry etching. In embodiments where the mask layer 158 is formed using the same process and material(s) as those used for forming the seed layer 150, the mask layer 158 may also be removed using the same process used for removing the seed layer 150.

Figure 9E:
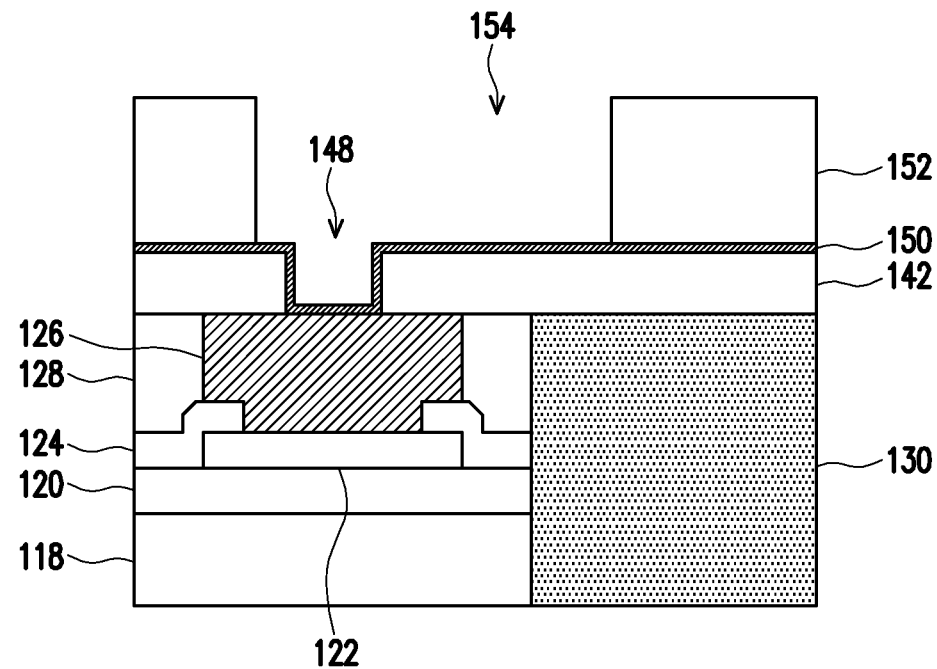

In FIG. 9E, the seed layer 150 is formed over the dielectric layer 142 and in the openings 148 through the dielectric layer 142. The photoresist 152 is then formed and patterned on the seed layer 150.

Figure 9F:
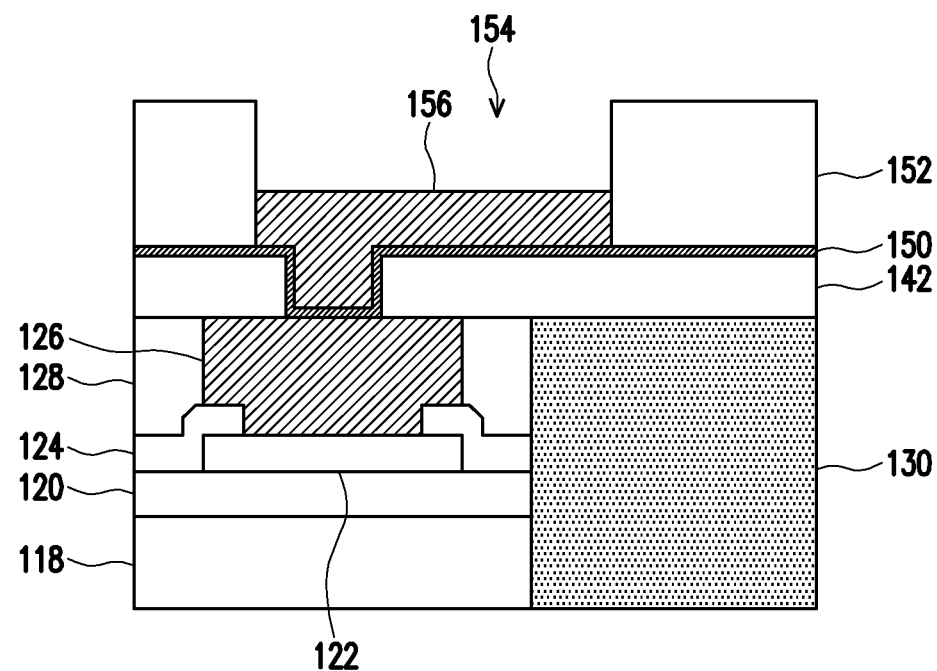

In FIG. 9F, the conductive material 156 is formed in the openings 154 of the photoresist 152 and on the exposed portions of the seed layer 150.

Figure 9G:
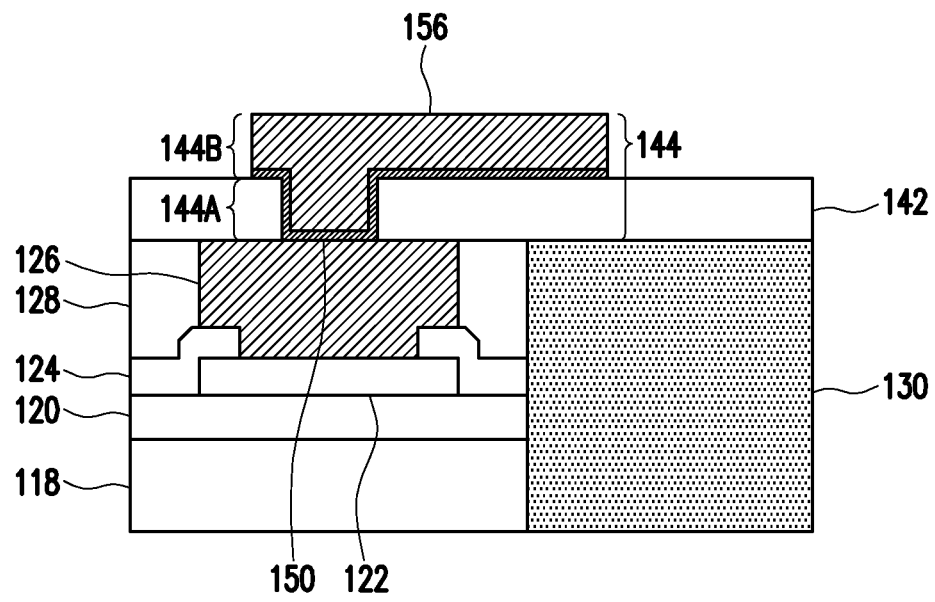

In FIG. 9G, the photoresist 152 and portions of the seed layer 150 on which the conductive material 156 is not formed are removed. The remaining portions of the seed layer 150 and conductive material 156 form the metallization pattern 144, which has conductive vias 144A and conductive lines 144B.

Figure 10:
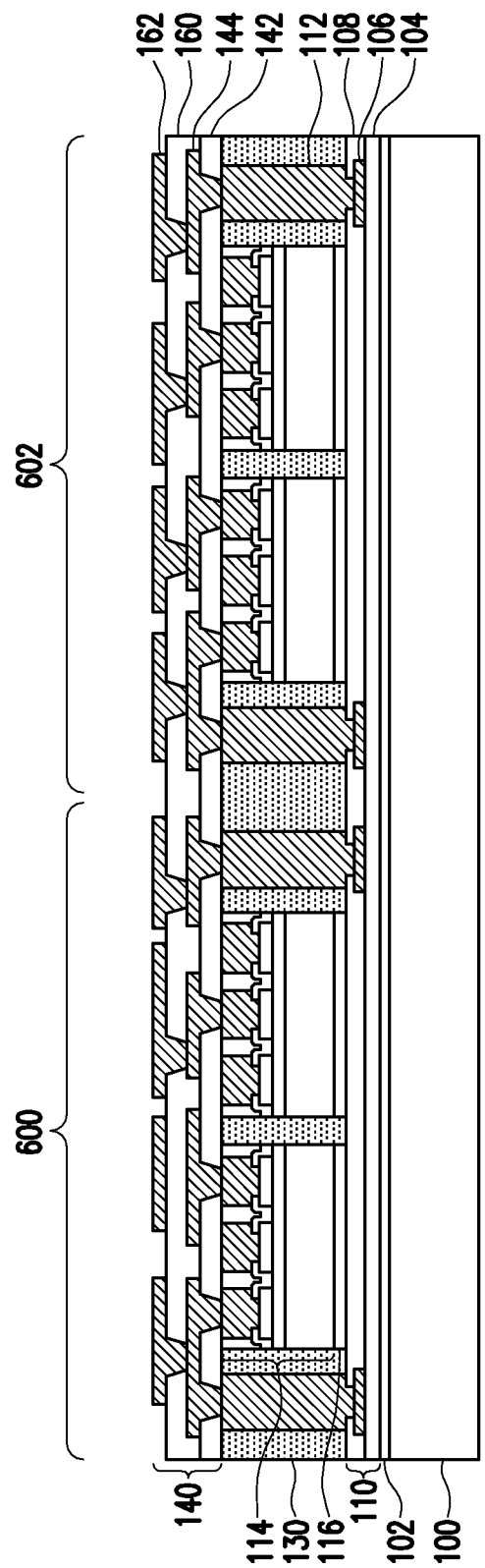

In FIG. 10, the dielectric layer 160 is deposited on the metallization pattern 144 formed using the process illustrated in FIGS. 8A-8F or FIGS. 9A-9G and the dielectric layer 142. The dielectric layer 160 is formed of a photo-sensitive material such as PBO, polyimide, BCB, or the like, which may be patterned using a lithography mask. In an embodiment, the dielectric layer 160 is a photo-sensitive polyimide. The dielectric layer 160 may be formed by spin coating, lamination, CVD, the like, or a combination thereof. Unlike the dielectric layer 142, the dielectric layer 160 may not be cured after formation, such that it retains its photo-sensitivity. The metallization pattern 162 is then formed on and extending through the dielectric layer 160. Several methods may be used to form the metallization pattern 162. FIGS. 11A through 11D illustrate a process for forming the metallization pattern 162, in accordance with an embodiment.

Figure 11A:
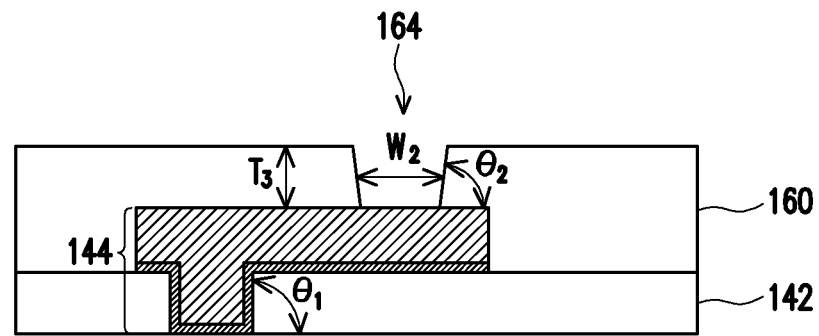

In FIG. 11A, the dielectric layer 160 is patterned. The patterning forms openings 164 exposing portions of the metallization pattern 144. Because the dielectric layer 160 is a photo-sensitive material, the patterning may be performed by exposing the dielectric layer 160 to light and developing the dielectric layer 160 after the exposure. Unlike the photolithography and etching process used to form the openings 148 (shown in FIGS. 8C and 9D), exposing the dielectric layer 160 to light and developing it forms the openings 164 with sidewall angles $\theta_2$ that are less steep than the sidewall angles $\theta_1$. The sidewall angles $\theta_2$ may be less than 85 degrees, such as from about 60 degrees to about 85 degrees. In other words, the sidewall angles $\theta_2$ are less than the sidewall angles $\theta_1$. The openings 164 are formed having a width $W_2$. The width $W_2$ may be greater than the width $W_1$, which may allow the openings 164 to be formed while avoiding challenges associated with forming openings of smaller critical dimensions, such as the openings 148. For example, the risk of under-development of the photo-sensitive material may be reduced, even when the width $W_2$ of the openings 164 is small (such as less than 3 μm) and the thickness $T_3$ of the dielectric layer 160 is large (such as greater than 5 μm).

Figure 11B:
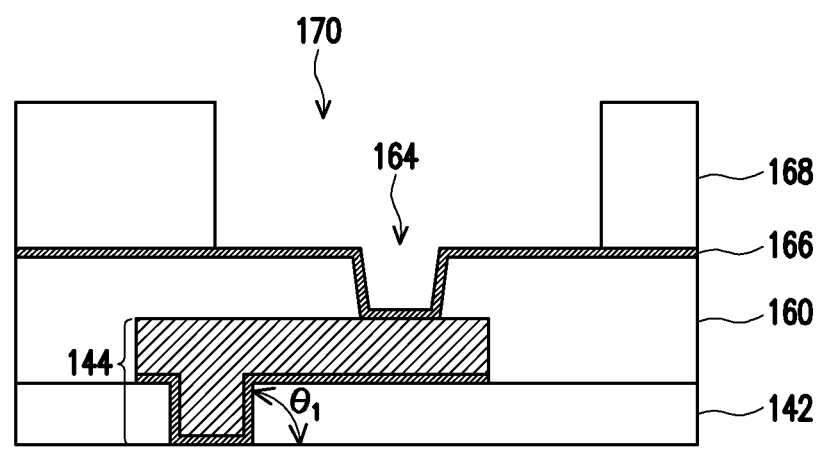

In FIG. 11B, a seed layer 166 is formed over the dielectric layer 160 and in the openings 164 through the dielectric layer 160. Portions of the seed layer 166 are formed on the metallization pattern 144. In some embodiments, the seed layer 166 is a metal layer, which may be a single layer or a composite layer comprising a plurality of sub-layers formed of different materials. In some embodiments, the seed layer 166 comprises a titanium layer and a copper layer over the titanium layer. The seed layer 166 may be formed using, for example, PVD or the like. A photoresist 168 is then formed and patterned on the seed layer 166. The photoresist 168 may be formed by spin coating or the like and may be exposed to light for patterning. The pattern of the photoresist corresponds to the metallization pattern 162. The patterning forms openings 170 through the photoresist to expose the seed layer 166.

Figure 11C:
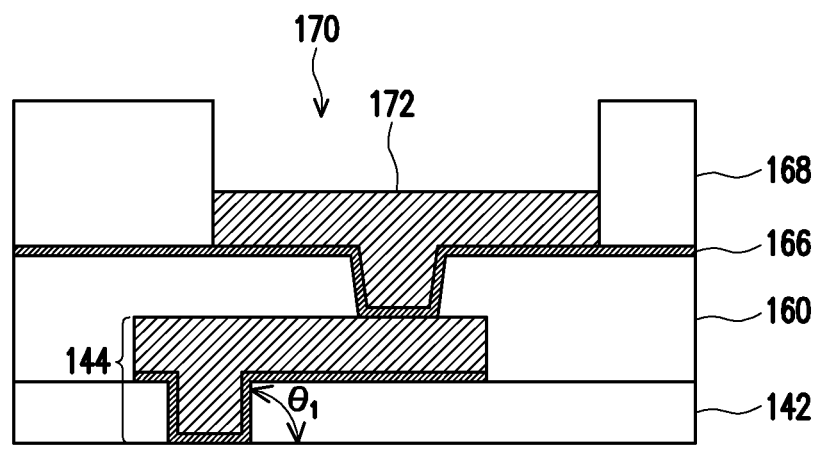

In FIG. 11C, a conductive material 172 is formed in the openings 170 of the photoresist 168 and on the exposed portions of the seed layer 166. The conductive material 172 may be formed by plating, such as electroplating or electroless plating, or the like. The conductive material 172 may comprise a metal such as copper, titanium, tungsten, aluminum, or the like.

Figure 11D:
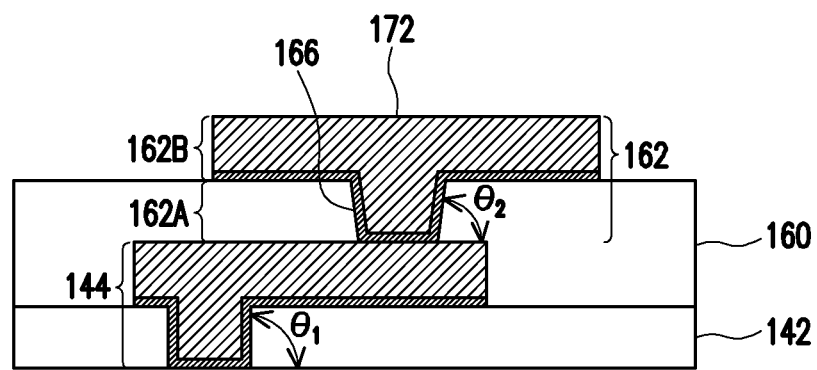

In FIG. 11D, the photoresist 168 and portions of the seed layer 166 on which the conductive material 172 is not formed are removed. The photoresist 168 may be removed by an acceptable ashing or stripping process, such as using an oxygen plasma or the like. Once the photoresist 168 is removed, exposed portions of the seed layer 166 are removed, such as by using an acceptable etching process, such as by wet or dry etching. The remaining portions of the seed layer 166 and conductive material 172 form the metallization pattern 162, which has conductive vias 162A and conductive lines 162B. The conductive vias 162A are formed in the openings 164 through the dielectric layer 160 to the metallization pattern 144. The conductive lines 162B are formed along the top surface of the dielectric layer 160. The metallization pattern 162 is electrically and physically connected to the metallization pattern 144.

Figure 12:
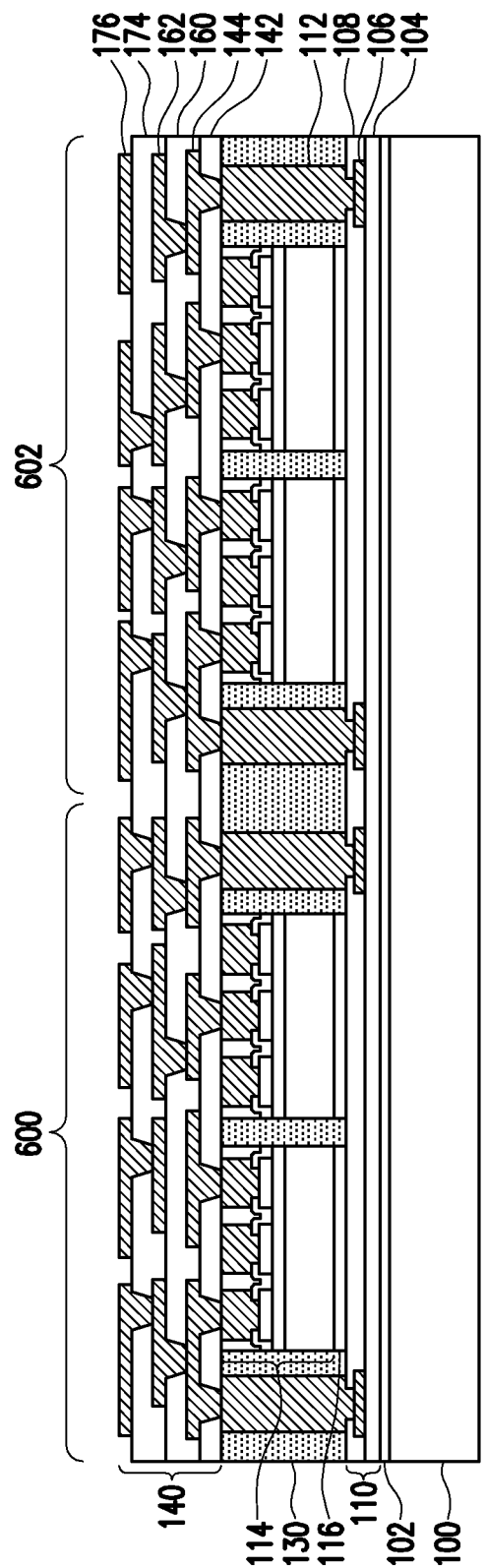

In FIG. 12, the dielectric layer 174 is deposited on the metallization pattern 162 and the dielectric layer 160. In some embodiments, the dielectric layer 174 is formed of a polymer, which may be a photo-sensitive material such as PBO, polyimide, BCB, or the like, that may be patterned using a lithography mask. In other embodiments, the dielectric layer 174 is formed of a nitride such as silicon nitride; an oxide such as silicon oxide, PSG, BSG, BPSG; or the like. The dielectric layer 174 may be formed by spin coating, lamination, CVD, the like, or a combination thereof.

The dielectric layer 174 is then patterned. The patterning forms openings to expose portions of the metallization pattern 162. The patterning may be by an acceptable process, such as by exposing the dielectric layer 174 to light when the dielectric layer 174 is a photo-sensitive material or by etching using, for example, an anisotropic etch. If the dielectric layer 174 is a photo-sensitive material, the dielectric layer 174 can be developed after the exposure.

The metallization pattern 176 with vias is formed on the dielectric layer 174. As an example to form metallization pattern 176, a seed layer (not shown) is formed over the dielectric layer 174 and in the openings through the dielectric layer 174. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 176. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 176 and vias. The vias are formed in openings through the dielectric layer 174 to, e.g., portions of the metallization pattern 162.

Figure 13:
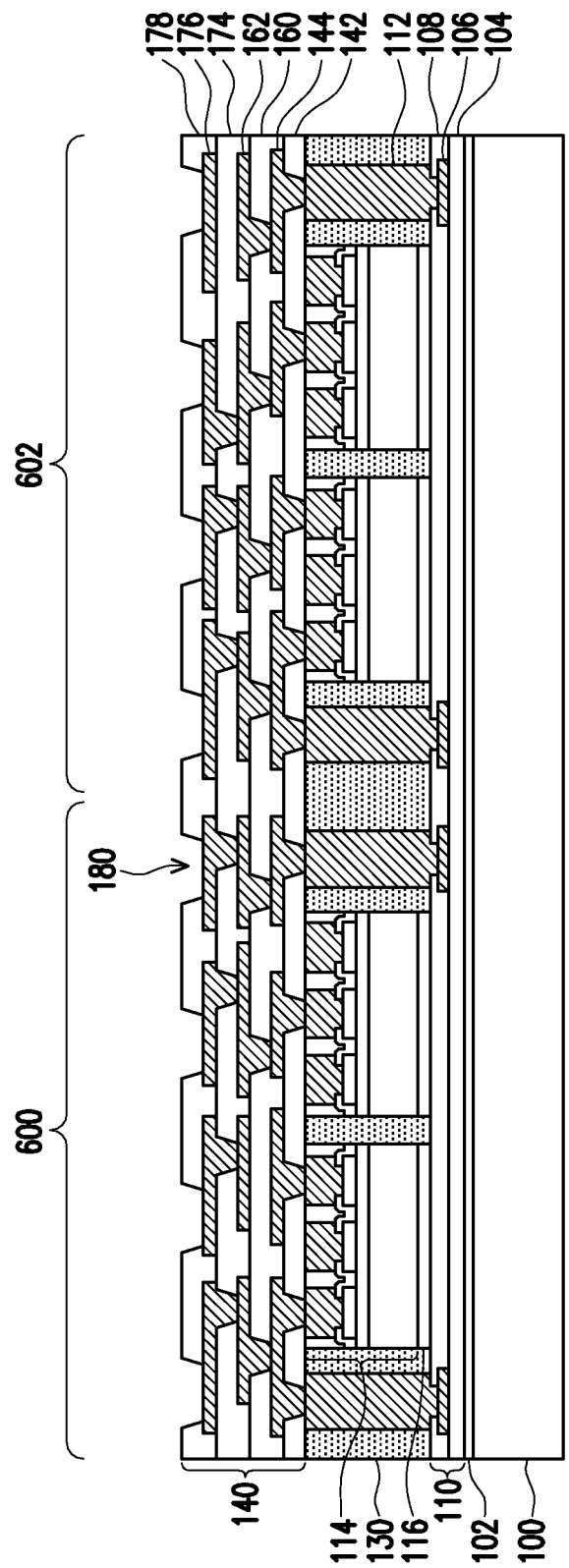

In FIG. 13, the dielectric layer 178 is deposited on the metallization pattern 176 and the dielectric layer 174. In some embodiments, the dielectric layer 178 is formed of a polymer, which may be a photo-sensitive material such as PBO, polyimide, BCB, or the like, that may be patterned using a lithography mask. In other embodiments, the dielectric layer 178 is formed of a nitride such as silicon nitride; an oxide such as silicon oxide, PSG, BSG, BPSG; or the like. The dielectric layer 178 may be formed by spin coating, lamination, CVD, the like, or a combination thereof.

The dielectric layer 178 is then patterned. The patterning forms openings 180 to expose portions of the metallization pattern 176. The patterning may be by an acceptable process, such as by exposing the dielectric layer 178 to light when the dielectric layer 178 is a photo-sensitive material or by etching using, for example, an anisotropic etch. If the dielectric layer 178 is a photo-sensitive material, the dielectric layer 178 can be developed after the exposure. The openings 180 may be wider than the openings for the via portions of the metallization patterns 144, 162, and 176.

Figure 14:
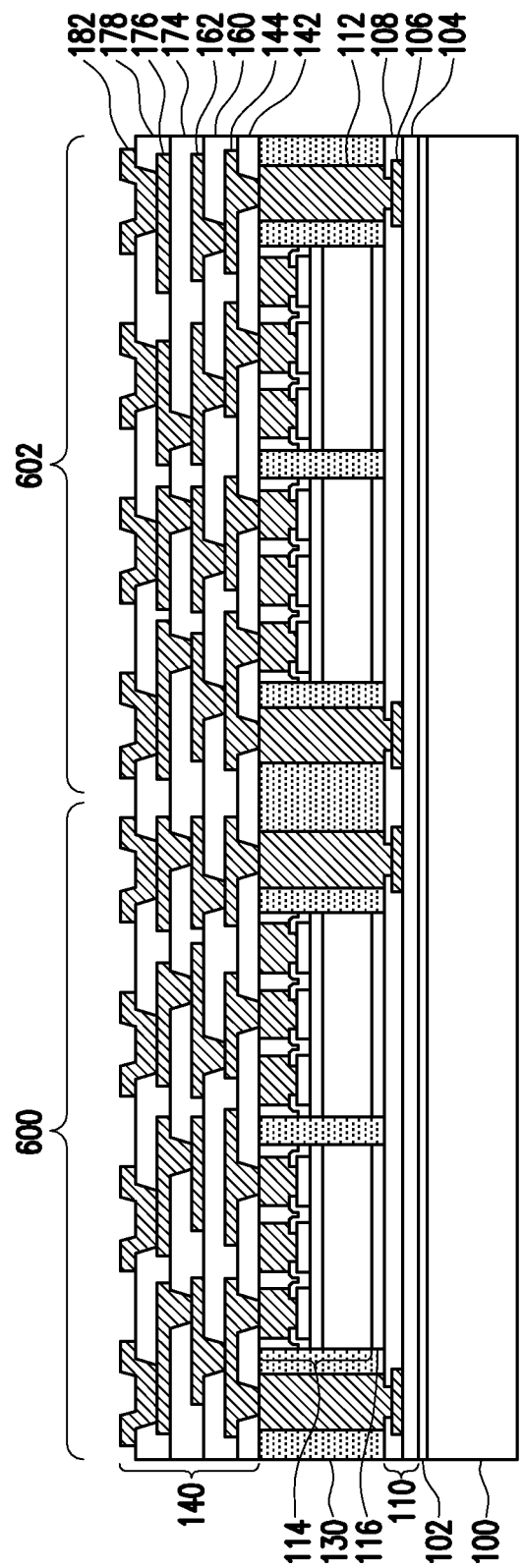

In FIG. 14, UBMs 182 are formed on the dielectric layer 178. In the illustrated embodiment, the UBMs 182 are formed through the openings 180 through the dielectric layer 178 to the metallization pattern 176. As an example to form the UBMs 182, a seed layer (not shown) is formed over the dielectric layer 178. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 182. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 182. In embodiments where the UBMs 182 are formed differently, more photoresist and patterning steps may be utilized.

The front-side redistribution structure 140 is shown as an example. More or fewer dielectric layers and metallization patterns may be formed in the front-side redistribution structure 140. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

It should further be appreciated that the processes for forming the metallization patterns 144, 162, and 176 may be varied based on the desired dimensions of the patterns. In the embodiment shown, the process of FIGS. 8A through 8F or the process of FIGS. 9A through 9G is used to form metallization patterns in the bottom level of the front-side redistribution structure 140, e.g., the metallization pattern 144. Such processes produce conductive lines and vias with smaller critical dimensions. Further, the process of FIGS. 11A through 11D is used to form metallization patterns in upper levels of the front-side redistribution structure 140, e.g., the metallization patterns 162 and 176. Such a process has a lower cost of manufacturing and may be used where conductive lines and vis with larger dimensions are acceptable. It should be appreciated that the process of FIGS. 8A through 8F or the process of FIGS. 9A through 9G may be used in multiple lower levels (e.g., both the metallization patterns 144 and 162) or all levels of the front-side redistribution structure 140.

Figure 15:
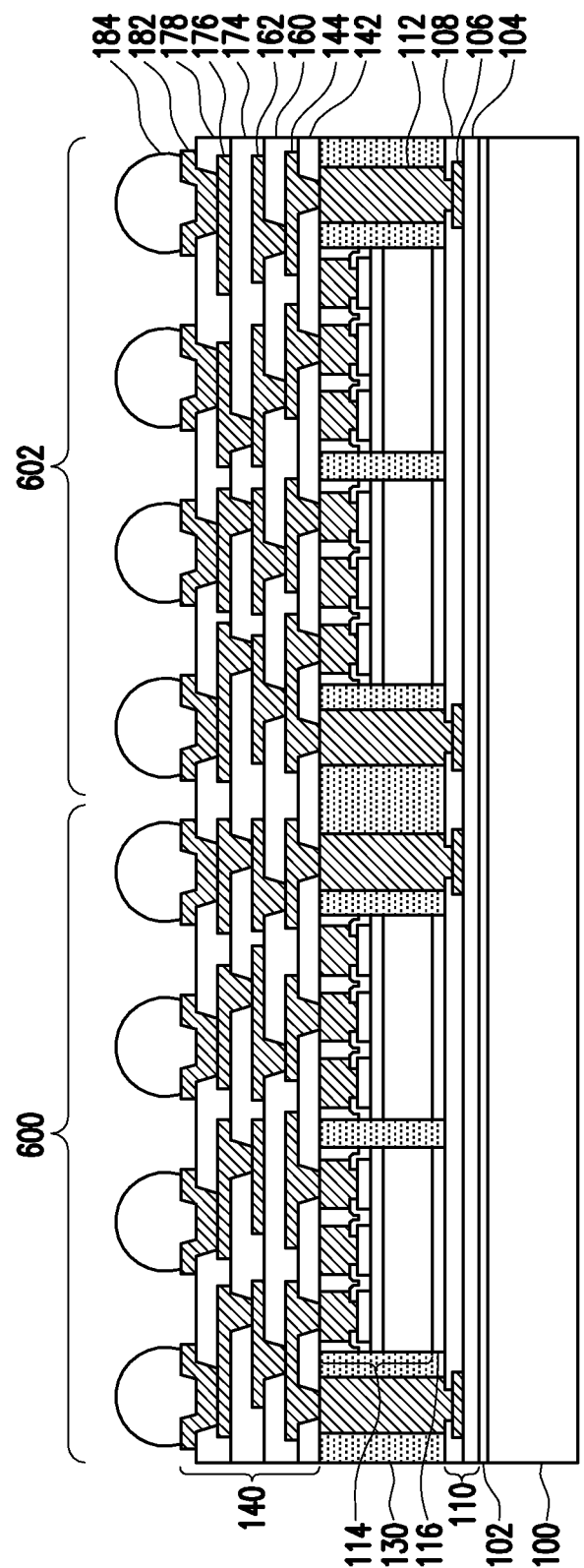

In FIG. 15, conductive connectors 184 are formed on the UBMs 182. The conductive connectors 184 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 184 may include a conductive material such as solder, copper, aluminum, gold, nickel, silver, palladium, tin, the like, or a combination thereof. In some embodiments, the conductive connectors 184 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 184 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
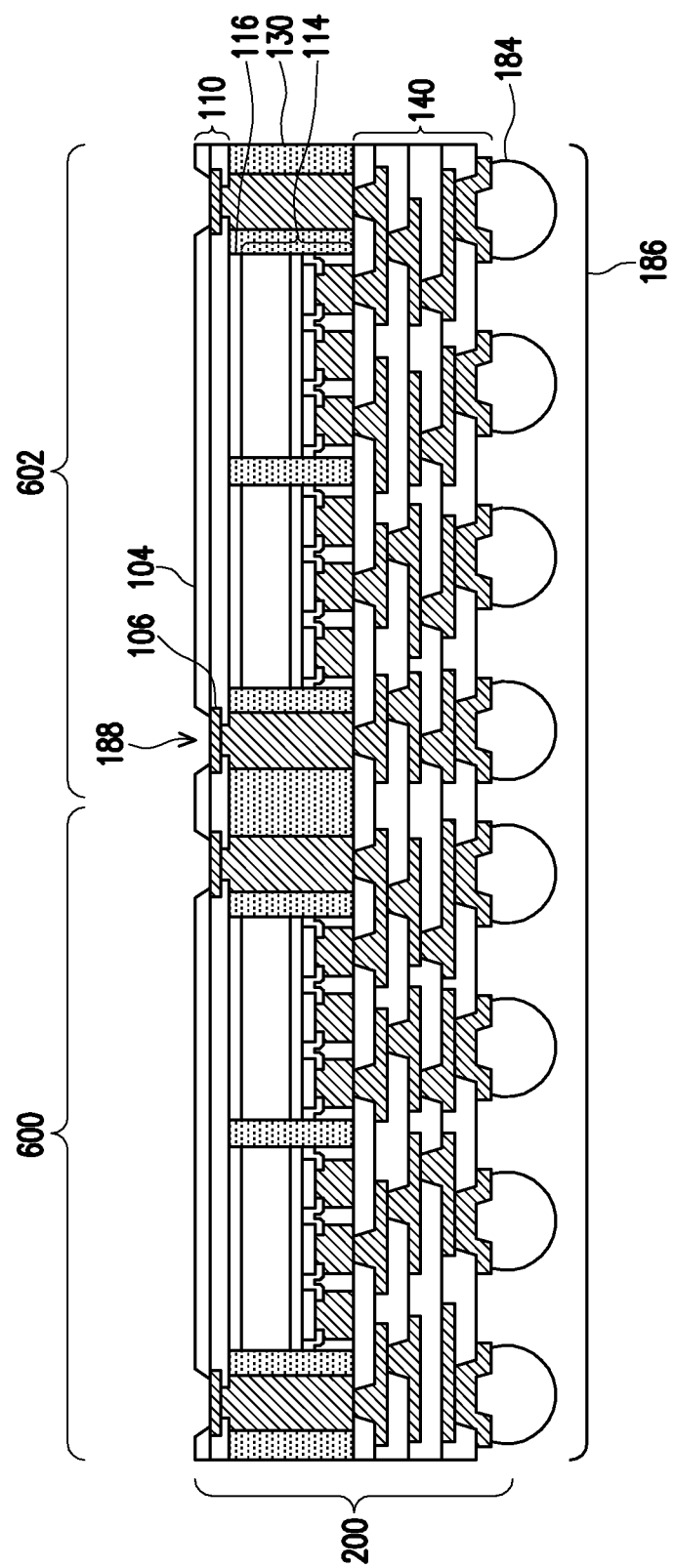

In FIG. 16, a carrier substrate de-bonding is performed to detach (de-bond) the carrier substrate 100 from the back-side redistribution structure 110, e.g., the dielectric layer 104. The first packages 200 are thereby formed in each of the first package region 600 and the second package region 602. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 186. Further, openings 188 are formed through the dielectric layer 104 to expose portions of the metallization pattern 106. The openings 188 may be formed, for example, using laser drilling, etching, or the like.

Figure 17:
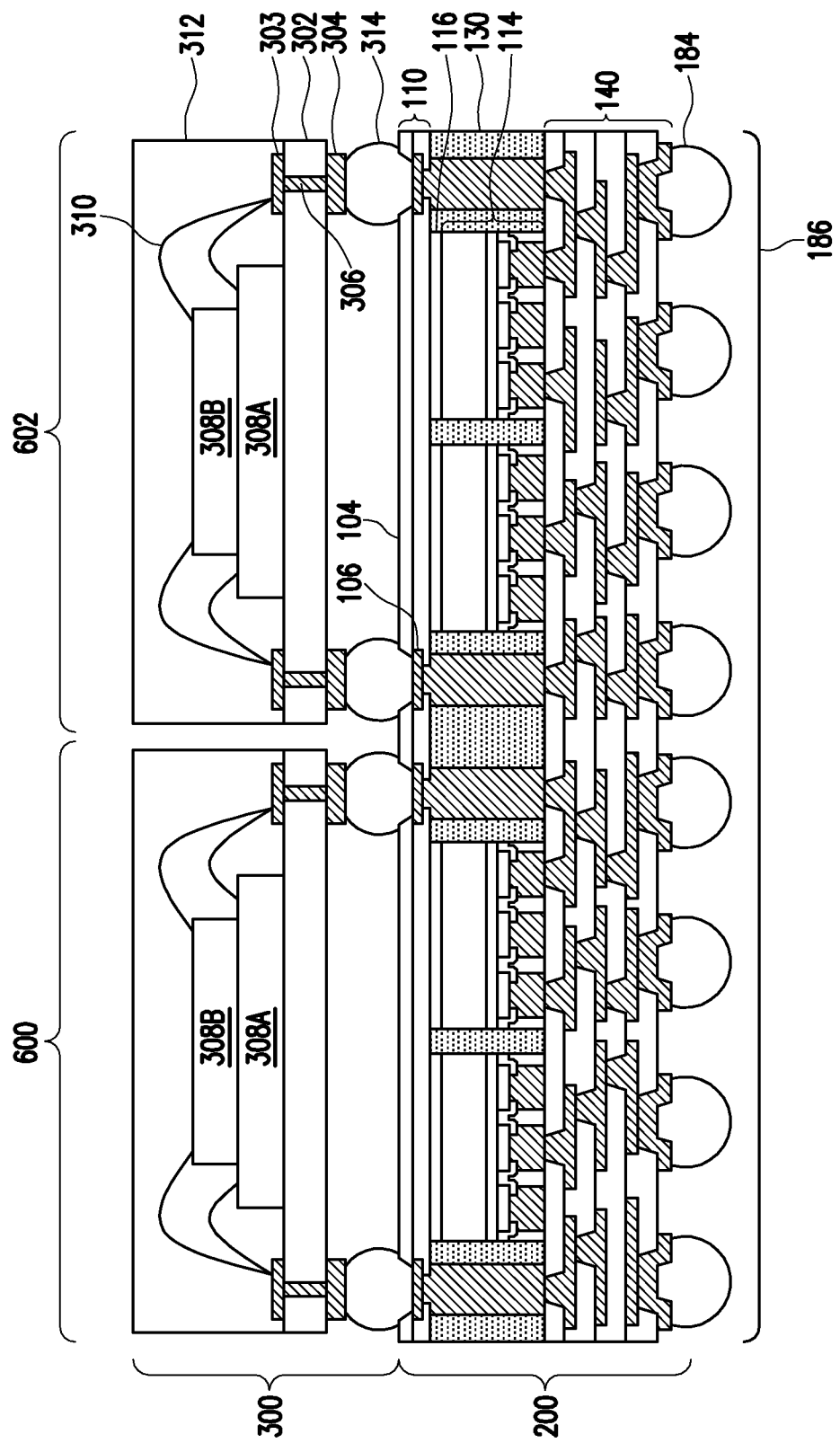
FIGS. 17 through 18 illustrate cross-sectional views of intermediate steps during a process for forming a package structure, in accordance with some embodiments.
Figure 18:
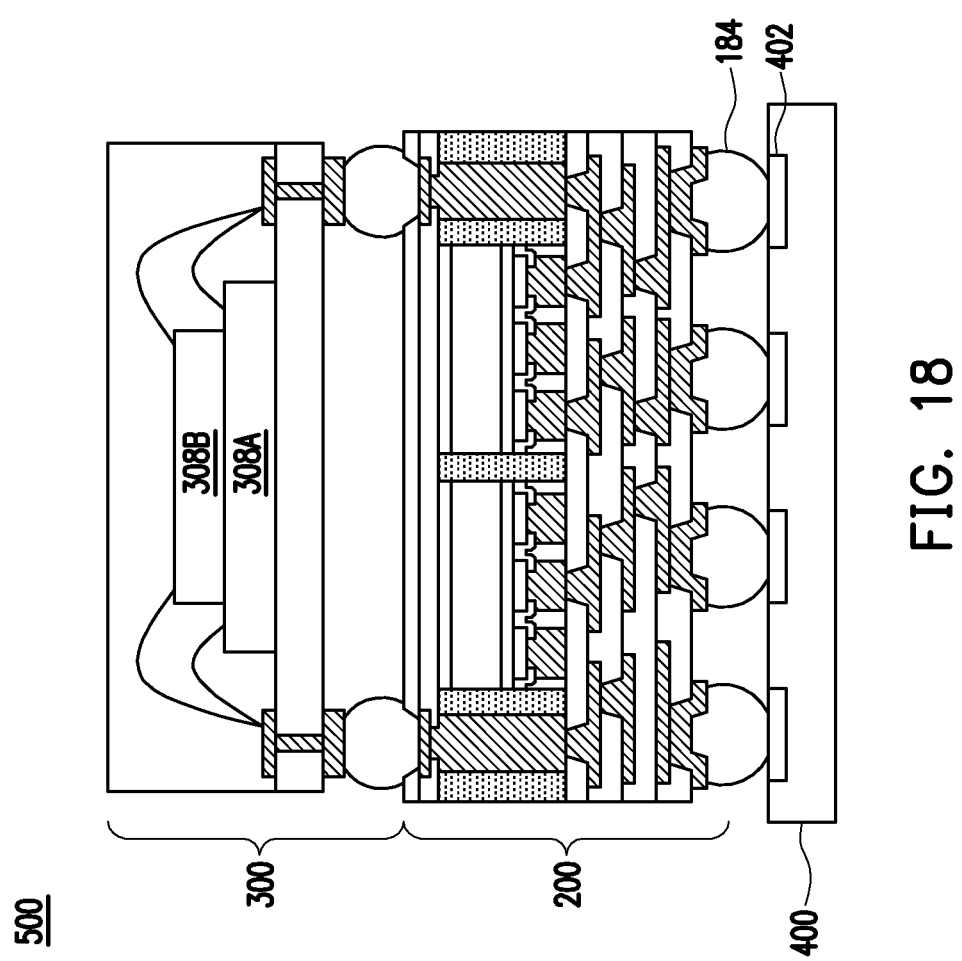

FIGS. 17 through 18 illustrate cross-sectional views of intermediate steps during a process for forming a package structure 500, in accordance with some embodiments. The package structure 500 may be referred to a package-on-package (PoP) structure.

In FIG. 17, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. For example, the bond pads 304 may be formed from copper, may be formed on a layer of titanium (not shown), and have a nickel finish, which may improve the shelf life of the device package 300, which may be particularly advantageous when the device package 300 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing process may be performed to cure the molding material 312; the curing process may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of conductive connectors 314, the bond pads 304, and the metallization pattern 106. In some embodiments, the stacked dies 308 may be coupled to the integrated circuit dies 114 through the wire bonds 310, the bond pads 303 and 304, through vias 306, the conductive connectors 314, and the through vias 112.

In some embodiments, a solder resist (not shown) is formed on the side of the substrate 302 opposing the stacked dies 308. The conductive connectors 314 may be disposed in openings in the solder resist to be electrically and mechanically coupled to conductive features (e.g., the bond pads 304) in the substrate 302. The solder resist may be used to protect areas of the substrate 302 from external damage.

In some embodiments, the conductive connectors 314 have an epoxy flux (not shown) formed thereon before they are reflowed with at least some of the epoxy portion of the epoxy flux remaining after the second package 300 is attached to the first package 200.

In some embodiments, an underfill (not shown) is formed between the first package 200 and the second package 300 and surrounding the conductive connectors 314. The underfill may reduce stress and protect the joints resulting from the reflowing of the conductive connectors 314. The underfill may be formed by a capillary flow process after the first package 200 is attached or may be formed by a suitable deposition method before the first package 200 is attached. In embodiments where the epoxy flux is formed, it may act as the underfill.

In FIG. 18, a singulation process is performed by sawing along scribe line regions, e.g., between the first package region 600 and the second package region 602. The sawing singulates the first package region 600 from the second package region 602. The resulting, singulated first and second packages 200 and 300 are from one of the first package region 600 or the second package region 602. In some embodiments, the singulation process is performed after the second package 300 is attached to the first package 200. In other embodiments (not shown), the singulation process is performed before the second package 300 is attached to the first package 200, such as after the carrier substrate 100 is de-bonded and the openings 188 are formed.

The first package 200 is then mounted to a package substrate 400 using the conductive connectors 184. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 184 are reflowed to attach the first package 200 to the bond pads 402. The conductive connectors 184 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 184.

The conductive connectors 184 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 184. In some embodiments, an underfill (not shown) may be formed between the first package 200 and the package substrate 400 and surrounding the conductive connectors 184. The underfill may be formed by a capillary flow process after the first package 200 is attached or may be formed by a suitable deposition method before the first package 200 is attached.

Embodiments may achieve advantages. Reference is made to FIGS. 8A-8F. Patterning the bottom dielectric layer 142 of the front-side redistribution structure 140 by a lithography and plasma etching technique allows the openings 148 to be formed to a narrower width. Reference is now made to FIGS. 9A-9G. Using a hardmask such as the mask layer 158 during the patterning may allow the etch selectivity between the dielectric layer 142 and photoresist 146 to be increased, allowing the width to be further decreased. Sidewalls of the openings 148 may also have a steeper profile. As such, the critical dimension of the formed vias may be decreased, allowing for a finer pitch between vias of the front-side redistribution structure 140. Finally, the pattern of the photoresist 146 may be reworked more easily than a pattern directly formed (e.g., by exposure and development) in the dielectric layer 142.

In an embodiment, a method includes: forming a first dielectric layer over a die, the first dielectric layer including a photo-sensitive material; curing the first dielectric layer to reduce photo-sensitivity of the first dielectric layer; patterning the first dielectric layer by etching to form a first opening; forming a first metallization pattern in the first opening of the first dielectric layer; forming a second dielectric layer over the first metallization pattern and the first dielectric layer, the second dielectric layer including the photo-sensitive material; patterning the second dielectric layer by exposure and development to form a second opening; and forming a second metallization pattern in the second opening of the second dielectric layer, the second metallization pattern electrically connected to the first metallization pattern.

In some embodiments, the method further includes: encapsulating the die and a through via with a molding compound; and planarizing the molding compound such that top surfaces of the die, the through via, and the molding compound are level, where the first dielectric layer is formed on the top surfaces of the die, the through via, and the molding compound. In some embodiments of the method, patterning the first dielectric layer includes: forming a first photoresist contacting the first dielectric layer; patterning the first photoresist with a first pattern; and transferring the first pattern from the first photoresist to the first dielectric layer with a first etching process. In some embodiments of the method, patterning the first dielectric layer includes: etching the first dielectric layer with a plasma etching process, the plasma etching process being performed with precursors including $O_2$ and $CF_4$ at a ratio of from about 6:1 to about 8:1. In some embodiments of the method, patterning the first dielectric layer includes: forming a first metal layer contacting the first dielectric layer; forming a first photoresist contacting the first metal layer; patterning the first photoresist with a first pattern; transferring the first pattern from the first photoresist to the first metal layer with a first etching process; and transferring the first pattern from the first metal layer to the first dielectric layer with a second etching process. In some embodiments of the method, patterning the first dielectric layer includes: etching the first dielectric layer with a plasma etching process, the plasma etching process being performed with precursors including fluoride and oxygen at a ratio of from about 20:1 to about 1:20.

In an embodiment, a method includes: forming a first photo-sensitive dielectric layer over a die; reducing photo-sensitivity of the first photo-sensitive dielectric layer to form a first passivation layer; forming a first photoresist contacting the first passivation layer; patterning the first photoresist with a first pattern; etching a first opening in the first passivation layer using the first pattern of the first photoresist as an etching mask; depositing a first seed layer in the first opening and along a top surface of the first passivation layer; and plating a first conductive material from the first seed layer to form a first metallization pattern.

In some embodiments of the method, etching the first opening in the first passivation layer includes: etching the first passivation layer with a plasma etching process. In some embodiments of the method, the plasma etching process is performed with precursors including $O_2$ and $CF_4$ at a ratio of from about 6:1 to about 8:1. In some embodiments, the method further includes: encapsulating the die and a through via with a molding compound; planarizing the molding compound such that top surfaces of the die, the through via, and the molding compound are level; and forming the first photo-sensitive dielectric layer over the die, the through via, and the molding compound. In some embodiments of the method, the first opening in the first passivation layer exposes the through via. In some embodiments of the method, the first opening in the first passivation layer exposes a connector of the die. In some embodiments, the method further includes: forming a second photo-sensitive dielectric layer over the first metallization pattern and the first passivation layer; patterning a second opening in the second photo-sensitive dielectric layer by exposing the second photo-sensitive dielectric layer to light, the second opening exposing the first metallization pattern; depositing a second seed layer in the second opening, along a top surface of the second photo-sensitive dielectric layer, and along a top surface of the first metallization pattern; and plating a second conductive material from the second seed layer to form a second metallization pattern.

In an embodiment, a method includes: forming a first photo-sensitive dielectric layer over a die; reducing photo-sensitivity of the first photo-sensitive dielectric layer to form a first passivation layer; forming a first metal layer contacting the first passivation layer; forming a first photoresist contacting the first metal layer; patterning the first photoresist with a first pattern; transferring the first pattern from the first photoresist to the first metal layer with a first etching process; etching a first opening in the first passivation layer using the first pattern of the first metal layer as an etching mask; depositing a first seed layer in the first opening and along a top surface of the first passivation layer; and plating a first conductive material from the first seed layer to form a first metallization pattern.

In some embodiments of the method, etching the first opening in the first passivation layer includes: etching the first passivation layer with a plasma etching process. In some embodiments of the method, the plasma etching process is performed with precursors including fluoride and oxygen at a ratio of from about 20:1 to about 1:20. In some embodiments, the method further includes: encapsulating the die and a through via with a molding compound; planarizing the molding compound such that top surfaces of the die, the through via, and the molding compound are level; and forming the first photo-sensitive dielectric layer over the die, the through via, and the molding compound. In some embodiments of the method, the first opening in the first passivation layer exposes the through via. In some embodiments of the method, the first opening in the first passivation layer exposes a connector of the die. In some embodiments, the method further includes: forming a second photo-sensitive dielectric layer over the first metallization pattern and the first passivation layer; patterning a second opening in the second photo-sensitive dielectric layer by exposing the second photo-sensitive dielectric layer to light, the second opening exposing the first metallization pattern; depositing a second seed layer in the second opening, along a top surface of the second photo-sensitive dielectric layer, and along a top surface of the first metallization pattern; and plating a second conductive material from the second seed layer to form a second metallization pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first dielectric layer on a conductive feature, the first dielectric layer comprising a photo-sensitive material;
   patterning a first opening in the first dielectric layer, the first opening exposing a first portion of the conductive feature, wherein the first dielectric layer is not patterned by exposure to light and development, wherein first sidewalls of the first opening form a first angle with a first plane, the first plane parallel to a first top surface of the first dielectric layer;
   forming a first metallization pattern in the first opening and along the first top surface of the first dielectric layer, the first metallization pattern contacting the first portion of the conductive feature;
   depositing a second dielectric layer on the first metallization pattern and the first dielectric layer, the second dielectric layer comprising the photo-sensitive material;
   patterning a second opening in the second dielectric layer, the second opening exposing a second portion of the first metallization pattern, wherein the second dielectric layer is patterned by exposure to light and development, wherein second sidewalls of the second opening form a second angle with a second plane, the second plane parallel to a second top surface of the second dielectric layer, the second angle being less than the first angle; and
   forming a second metallization pattern in the second opening and along the second top surface of the second dielectric layer, the second metallization pattern contacting the second portion of the first metallization pattern.

2. The method of claim 1, wherein patterning the first opening in the first dielectric layer comprises:
reducing photo-sensitivity of the first dielectric layer;
after reducing photo-sensitivity of the first dielectric layer, forming a photoresist on the first dielectric layer, the photoresist having a pattern of the first opening; and
etching the first dielectric layer with a plasma etching process using the photoresist as an etching mask.

3. The method of claim 2, wherein the first angle is from 75 degrees to 85 degrees and the second angle is from 60 degrees to 85 degrees.

4. The method of claim 2, wherein the plasma etching process is performed with tetrafluoromethane and oxygen.

5. The method of claim 1, wherein patterning the first opening in the first dielectric layer comprises:
reducing photo-sensitivity of the first dielectric layer;
after reducing photo-sensitivity of the first dielectric layer, forming a metal mask on the first dielectric layer, the metal mask having a pattern of the first opening; and
etching the first dielectric layer with a plasma etching process using the metal mask as an etching mask.

6. The method of claim 5, wherein the first angle is from 85 degrees to 90 degrees and the second angle is from 60 degrees to 85 degrees.

7. The method of claim 5, wherein the plasma etching process is performed with fluoride and oxygen.

8. The method of claim 1, wherein the conductive feature is a conductive via extending through an encapsulant, and depositing the first dielectric layer comprises depositing the first dielectric layer on the conductive via and the encapsulant.

9. The method of claim 1, wherein the conductive feature is a die connector of an integrated circuit die, and depositing the first dielectric layer comprises depositing the first dielectric layer on the integrated circuit die.

10. A method comprising:
encapsulating an integrated circuit die with a molding compound;
forming a first dielectric layer over the molding compound and the integrated circuit die, the first dielectric layer comprising a photo-sensitive material;
performing a thermal curing process to reduce photo-sensitivity of the first dielectric layer;
after the thermal curing process, patterning the first dielectric layer by masking and etching to form a first opening;
forming a first metallization pattern in the first opening of the first dielectric layer, the first metallization pattern electrically connected to the integrated circuit die;
forming a second dielectric layer over the first metallization pattern and the first dielectric layer, the second dielectric layer comprising the photo-sensitive material;
patterning the second dielectric layer by exposure and development to form a second opening; and
forming a second metallization pattern in the second opening of the second dielectric layer, the second metallization pattern electrically connected to the first metallization pattern.

11. The method of claim 10, further comprising:
placing the integrated circuit die adjacent a through via;
encapsulating the through via with the molding compound; and
planarizing the molding compound such that top surfaces of the integrated circuit die, the through via, and the molding compound are coplanar,
wherein the first dielectric layer is formed on the top surfaces of the integrated circuit die, the through via, and the molding compound.

12. The method of claim 10, wherein patterning the first dielectric layer comprises:
forming a first photoresist contacting the first dielectric layer;
patterning the first photoresist with a first pattern; and
transferring the first pattern from the first photoresist to the first dielectric layer with a first etching process.

13. The method of claim 12, wherein the first etching process comprises:
etching the first dielectric layer with a plasma etching process, the plasma etching process being performed with precursors comprising oxygen and tetrafluoromethane at a ratio of from 6:1 to 8:1.

14. The method of claim 10, wherein patterning the first dielectric layer comprises:
forming a first metal layer contacting the first dielectric layer;
forming a first photoresist contacting the first metal layer;
patterning the first photoresist with a first pattern;
transferring the first pattern from the first photoresist to the first metal layer with a first etching process; and
transferring the first pattern from the first metal layer to the first dielectric layer with a second etching process.

15. The method of claim 14, wherein the second etching process comprises:
etching the first dielectric layer with a plasma etching process, the plasma etching process being performed with precursors comprising fluoride and oxygen at a ratio of from 20:1 to 1:20.

16. The method of claim 10, wherein the first dielectric layer is not exposed to light before the thermal curing process.

17. The method of claim 10, wherein first sidewalls of the first opening form a first angle with a first plane, the first plane parallel to a first top surface of the first dielectric layer, and second sidewalls of the second opening form a second angle with a second plane, the second plane parallel to a second top surface of the second dielectric layer, the second angle being less than the first angle.

18. A method comprising:
encapsulating an integrated circuit die and conductive vias with a molding compound;
depositing a first dielectric layer on the integrated circuit die, the conductive vias, and the molding compound, the first dielectric layer comprising a photo-sensitive material;
reducing photo-sensitivity of the first dielectric layer by thermally curing the first dielectric layer;
after reducing the photo-sensitivity of the first dielectric layer, patterning first openings in the first dielectric layer with a first type of patterning process, the first openings exposing the integrated circuit die and the conductive vias;
forming a first metallization pattern in the first openings;
depositing a second dielectric layer on the first metallization pattern and the first dielectric layer, the second dielectric layer comprising the photo-sensitive material;
patterning second openings in the second dielectric layer with a second type of patterning process, the second type of patterning process being different from the first type of patterning process, the second openings exposing the first metallization pattern; and forming a second metallization pattern in the second openings.

19. The method of claim 18, wherein the first type of patterning process comprises masking and etching.

20. The method of claim 18, wherein the second type of patterning process comprises exposure and development.

* * * * *